United States Patent [19]
Robb et al.

[11] Patent Number: 5,396,097
[45] Date of Patent: Mar. 7, 1995

[54] TRANSISTOR WITH COMMON BASE REGION

[76] Inventors: Stephen P. Robb, 211 W. Greentree Dr., Tempe, Ariz. 85284; William L. Fragale, 6527 E. Turquoise Ave., Scottsdale, Ariz. 85253; Paul J. Groenig, 4109 W. San Juan Ave., Phoenix, Ariz. 85019

[21] Appl. No.: 272,899

[22] Filed: Jul. 8, 1994

Related U.S. Application Data

[63] Continuation-in-part of Ser. No. 155,504, Nov. 22, 1993, abandoned.

[51] Int. Cl.⁶ .................. H01L 29/78; H01L 29/10
[52] U.S. Cl. .................. 257/341; 257/339; 257/342
[58] Field of Search ............ 257/328, 335, 339–342, 257/139

[56] References Cited

U.S. PATENT DOCUMENTS

| | | |
|---|---|---|
| 4,135,289 | 1/1979 | Brews et al. . |
| 4,210,465 | 7/1980 | Brower . |
| 4,212,684 | 7/1980 | Brower . |
| 4,236,166 | 11/1980 | Cho et al. . |
| 4,593,302 | 6/1986 | Lidow et al. ............ 257/342 |
| 4,599,576 | 7/1986 | Yoshida et al. . |
| 4,823,176 | 4/1989 | Baliga et al. . |
| 4,860,072 | 8/1989 | Zommer . |
| 5,047,813 | 9/1991 | Harada ................ 257/341 |
| 5,086,323 | 2/1992 | Nakagawa et al. . |
| 5,093,701 | 3/1992 | Nakagawa et al. . |
| 5,208,471 | 5/1993 | Mori et al. .............. 257/328 |
| 5,304,831 | 4/1994 | Yilmax et al. ............ 257/341 |

Primary Examiner—Gene M. Munson
Attorney, Agent, or Firm—Aaron B. Bernstein

[57] ABSTRACT

A transistor (200) comprises a single, common base region (202). One or more source regions (112) are formed in the base region (202). One or more gate regions (120) overly the common base (202) and the source regions (112). In an alternate embodiment, the gate regions (320) have a raised central portion (321). In yet another embodiment, certain source regions (402) are cross connected (404). Additionally, a polysilicon pattern (602) may be used which provides a gate finger feed network (614, 616, 618), and gate fingers (604, 606, 608, 620) having length less than one half of the longest die dimension.

24 Claims, 4 Drawing Sheets

TRANSISTOR WITH COMMON BASE REGION

This application is a continuation-in-part of prior application Ser. No. 08/155,504, filed Nov. 22, 1993, now abandoned.

FIELD OF THE INVENTION

The present invention relates to semiconductor devices, and more particularly to transistors having common base regions and transistors having efficient and effective layout.

BACKGROUND OF THE INVENTION

In the past, vertical-type transistors such as power MOSFETs (Metal Oxide Silicon Field Effect Transistor) have comprised discrete and separate base region cells which define discrete and separate active regions. In a typical device die comprising many of such regions, the regions are electrically coupled together so that they act as a single transistor. Separate cells give rise to certain disadvantages. For example, the base-emitter region of every cell must be shorted for maximum energy. In addition, cell corners have adverse effects on breakdown voltage.

Furthermore, transistor configurations which are alternative to cells, such as stripes, have given rise to particular disadvantages. For example, striped-layout transistors inherently comprise elongated gate fingers. Electrical contact must be made to these elongated gate fingers in order to turn on or turn off the transistor. Conventionally, electrical connection to the elongated gate fingers are made at their extreme ends. Contacting the gate fingers at their ends creates a resistance to the gate finger which varies along its length. Consequently, the transistor's performance characteristics vary along the length of the gate finger. It will be recognized by those skilled in the art that this condition is undesirable.

Consequently, what is needed is a transistor which avoids the problem of individual, separate cells. Furthermore, what is needed is a transistor which has an efficient and effective layout such that transistor performance parameters do not vary materially at different locations of the device.

DETAILED DESCRIPTION OF THE DRAWINGS

Generally stated, one preferred embodiment of the present invention is a Metal Oxide Silicon Field Effect Transistor (MOSFET) which has a single common "base region". The base region is sometimes referred to, by those with average knowledge of the industry, as a body region, tub or well. In an enhancement mode N-channel MOSFET, which is typical in the industry, the base region is the region of the structure which is P+ and P-doped to provide the channel region for the field effect transistor. Additionally, it will be understood by those with average knowledge of the industry that similar technology applies to Insulated Gate Bipolar Transistors (IGBT) and P channel MOSFETS, as well. The device with a single common base region eliminates the exterior corners found in separate cell devices, thereby improving breakdown voltage. Additionally, the single common base region device reduces the probability of open base avalanche injection.

Figure 1:
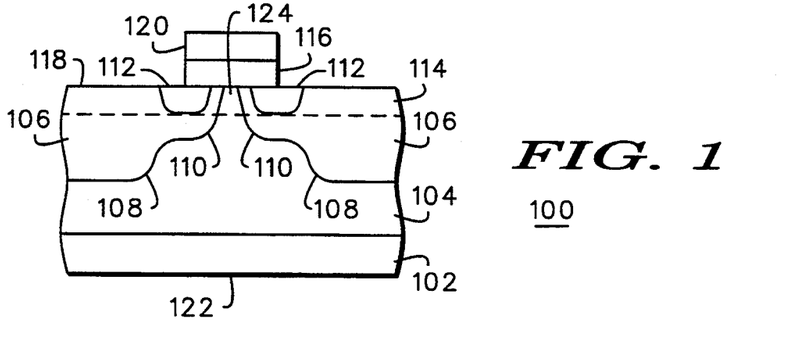
FIG. 1 is a simplified cross-sectional view of a vertical MOS transistor in accordance with one embodiment of the present invention.

Turning to the figures for a more detailed understanding, FIG. 1 is a simplified cross-section of a portion of a MOSFET in accordance with one embodiment of the present invention. More specifically, MOSFET 100 is a vertically stacked semiconductor structure. Transistor 100 is an enhancement mode N-channel MOSFET Transistor 100 comprises N+-type substrate 102. N-type epitaxial layer 104 is grown to a sufficient thickness on substrate 102 in accordance with methods well known in the industry.

Figure 2:
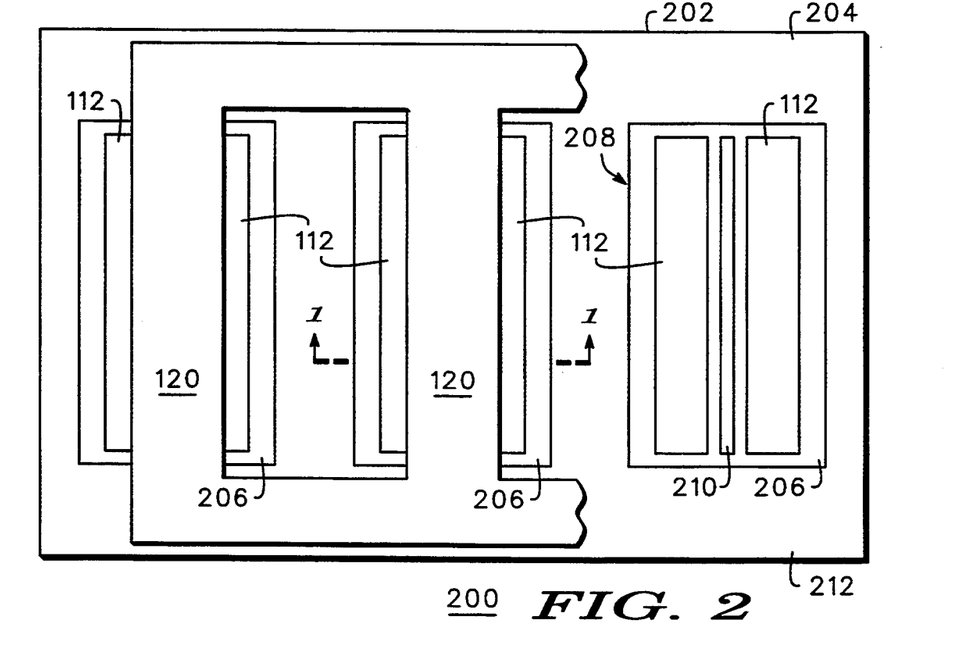
FIG. 2 is a simplified top view of a transistor in accordance with one embodiment of the present invention.

P-type regions 106 are part of a larger common base region which will be further illustrated in the top view of FIG. 2. P-type region 106 comprises P+-region 108, the lower lobe of the region, and P-region 110, the upper lobe of the region.

Transistor 100 further comprises source regions 112 which are N+-type doped. Source regions 112 reside generally in the upper lobe region 110 of the common base region 106.

Additionally, transistor 100 includes N-doped layer 114 which improves certain operating parameters. Layer 114 is sometimes referred to as the pre-gate implant layer because it is formed prior to forming the gate of the device. The N-type doping of regions 112 and layer 114 are considered a first dopant type. Specifically, layer 114 reduces the on-resistance of the transistor.

Oxide portion 116 resides on a first surface 118 of transistor 100. The edges of oxide layer 116 overlap upper lobe portions 110 of common base region 106, as well as source regions 112. Gate portion 120 overlies oxide portion 116. Those with average knowledge of the industry will be quite familiar with the operation of the MOSFET illustrated in FIG. 1, as well as the process technologies available for fabricating the device illustrated. It will be understood that transistor 100 conducts current vertically between first surface 118 and second surface 122, which is the bottom surface and is parallel to first surface 118.

Turning to FIG. 2, FIG. 2 particularly illustrates one of the important novel features of the embodiment of the present invention being described. More specifically, FIG. 2 is a simplified top view of a transistor 200 in accordance with one embodiment of the present invention. Transistor 200 includes the transistor portion 100 shown in FIG. 1, as indicated by the dashed line marked with the number 1. Transistor 200 comprises single common base region 202. Single common base region 202 includes P+-type portions 204 as well as P-type portions 206. The lines of FIG. 2 defining regions 206 merely indicate a transition between of P-type concentration, from P+ to P−. Referring briefly back to FIG. 1 for a better understanding, P+-type portions 204 make up lower lobes 108 of base region 106. Furthermore, P-type portions 206 make up upper lobes 110 of base region 106. Additionally, source regions 112 can be seen from the top view in FIG. 2. Furthermore, gate 120 is shown in top view, in FIG. 2.

The gate of transistor portion 208 has been left off of FIG. 2 so as to reveal details below the gate. More specifically, an epitaxial portion 210 is revealed. Referring again to FIG. 1, an epitaxial portion 210 is analogous to portion 124, centered below gate 120.

Certain notable features of transistor 200 in accordance with one embodiment of the present invention are revealed by the top view shown in FIG. 2. Specifically, transistor 200 comprises a single common base region 202 having several small regions where epitaxial portions (e.g., portion 210) are revealed. Due to the geometry of this particular embodiment, single common base region 202 is considered a striped base region. The stripes are considered to run vertically in the figure, between epitaxial portions 210. Transistor 200, and similar transistors, comprise at least two of these elongated base portions, or stripes. The stripes are joined integrally by base region border 212. Base region border 212 is the rectangular shaped outer edge of common base region 202.

Referring to FIG. 2, source regions 112 are formed in portions 208 of common base region 202. More specifically, in the embodiment shown, source regions 112 are opposing parallel elongated regions.

Overlying base region 202 and source regions 112 are gate regions 120. In the embodiment shown, gate regions 120 comprise elongated gate regions or gate fingers.

Figure 3:
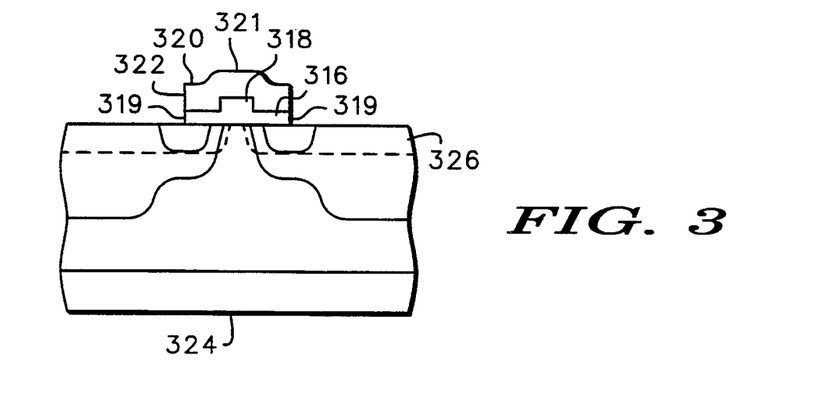
FIG. 3 is a simplified cross-sectional view of an alternative embodiment of a transistor in accordance with the present invention.

FIG. 3 is a simplified cross section of an alternative embodiment of a portion 208 of transistor 200. One notable distinction between the embodiment shown in FIG. 3 and the embodiment shown in FIG. 1 is the configuration of oxide layer 316. Oxide layer 316 has a central portion 318 and edge portions 319. Central portion 318 is higher than edge portions 319. The configuration of gate oxide layer 316 is achieved with well known processing techniques. Polysilicon gate 320 is formed over gate oxide layer 316. Due to the shape of gate oxide layer 316, polysilicon gate 320 includes a raised central portion 321 and edge portions 322. Central portion 321 is higher than edge portions 322.

The configuration of the gate oxide layer 316 and polysilicon gale 320 provides the advantage of reduced gate to drain capacitance for the device. It will be understood by those with average knowledge of the industry that the drain is considered to be an electrical contact on the bottom surface 324 of the device. Additionally, the configuration of layer 316 and gate 321 has the effect of causing pre-gate implant layer 326 to be discontinuous beneath the central portion 321 of gate 320. This discontinuity in the region beneath the center of the gate provides improved operation parameters as well. For example, improved on-resistance in high voltage devices is achieved.

Figure 4:
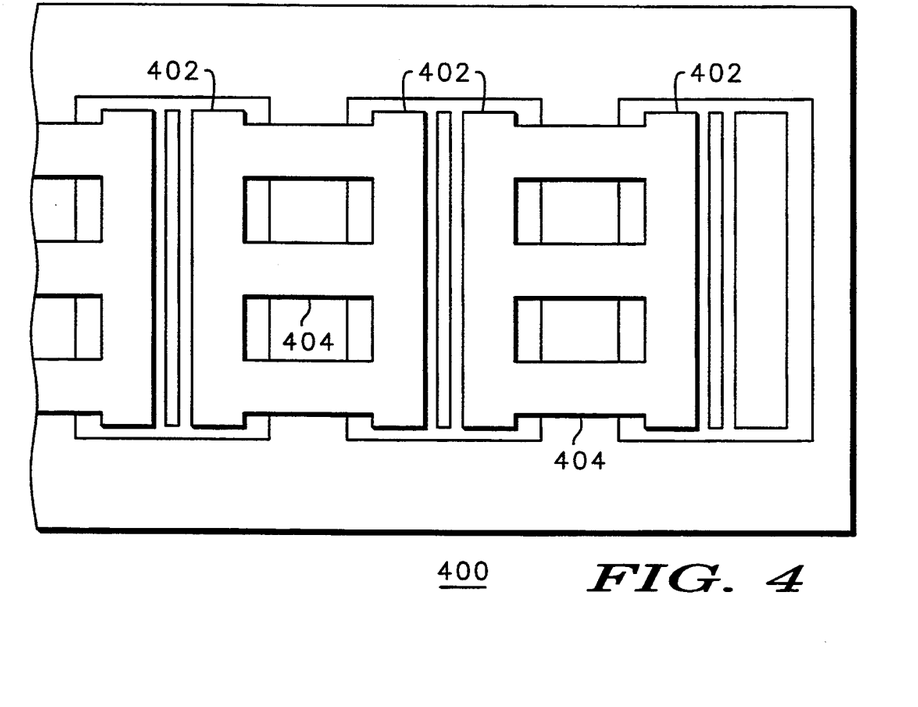
FIG. 4 is a partial top view of an alternative embodiment of a transistor in accordance with the present invention.

FIG. 4 illustrates an alternative embodiment of a transistor in accordance with the present invention. More specifically, transistor 400 of FIG. 4 is very similar to transistor 200 of FIG. 2, however, certain adjacent source regions are cross connected. More specifically, elongated source regions 402 are cross connected with adjacent elongated source regions by regions 404. Regions 404 are N+-type doped regions similar in nature to the elongated source regions 402. The advantages provided by the cross connected source regions are illustrated by FIG. 5.

Figure 5:
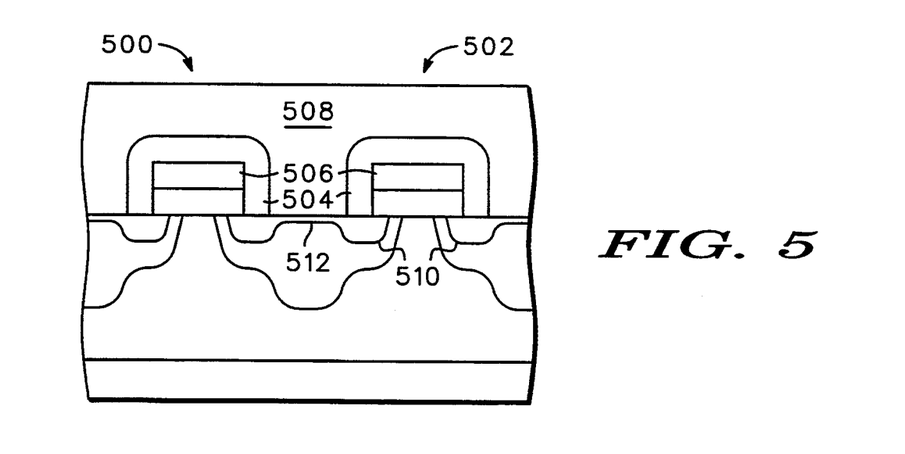
FIG. 5 is a simplified cross-sectional view of an alternative embodiment of a transistor in accordance with the present invention.

FIG. 5 is a cross section of a portion of a transistor consistent with the layout in FIG. 4. More specifically, FIG. 5 shows two device portions, 500 and 502. The structure of FIG. 5 is very similar to the structure of FIG. 1. Furthermore, FIG. 5 additionally shows an insulating oxide layer 504 covering polysilicon gates 506. On top of insulating oxide layer 504 is metal layer 508. As will be well understood by those with average knowledge of the industry, metal layer 508 provides the source electrode of the device. Consequently, it will be recognized that it is important that metal layer 508 contact elongated source regions 510.

As the density of the device increases, there will be less room available to lengthen elongated source regions 510 in the general area between transistor portions 500 and 502. Nevertheless a good electrical contact to metal layer 508 is required. Consequently, the cross connecting regions 512 are provided. Cross connecting regions 512 allow for sufficient and substantial electrical contact from metal layer 508 to elongated source regions 510. Consequently, higher packing densities can be achieved.

Figure 6:
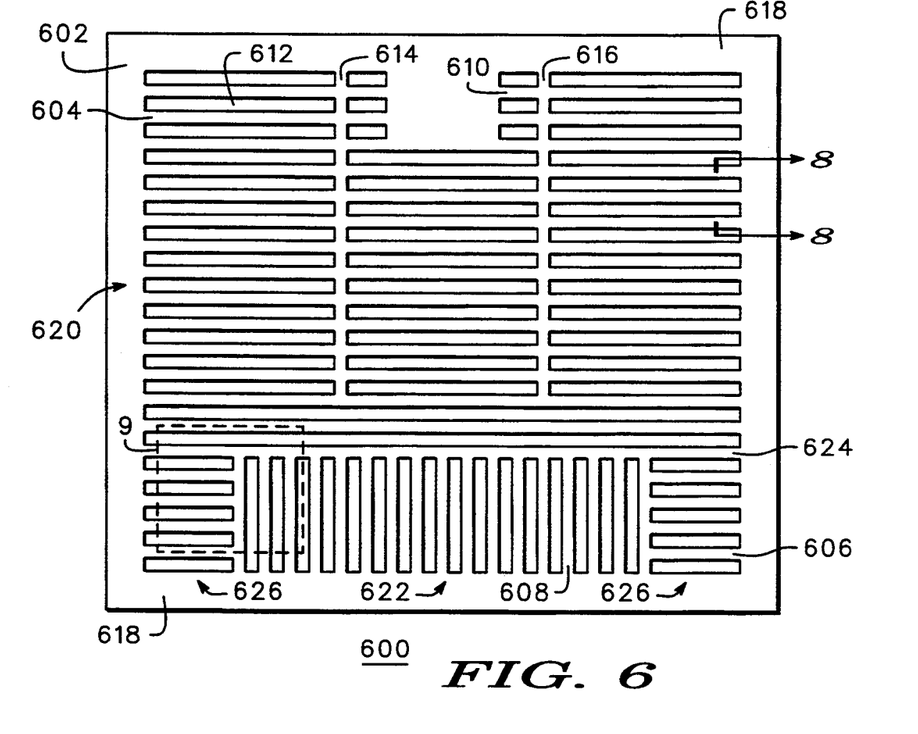
FIG. 6 is a simplified top view illustrating the layout of a transistor die including patterned polysilicon forming gate fingers.

Turning now to FIG. 6, FIG. 6 illustrates a particularly efficient and effective layout of an entire transistor die in accordance with the present invention. In order to best illustrate the layout of the die, FIG. 6 shows the patterned polysilicon 602 making the gate fingers, represented by gate fingers 604, 606, 608 and 610. FIG. 6 can be related to the simplified drawing of FIG. 2 in order to enhance the understanding of FIG. 6. More specifically, a gate finger 604 of FIG. 6 corresponds to gate finger 120 of FIG. 2. An opening 612 in the patterned polysilicon 602 of the die 600 corresponds to the opening in FIG. 2 between the two gate fingers 120. Referring to FIG. 2, it can be seen that this opening exposes source regions 112. However, for the sake of clarity, the detail of the source regions such as 112 in FIG. 2 is not shown within the opening 612 of FIG. 6. Nevertheless, it will be understood that such source regions are exposed by the openings 612 throughout the patterned polysilicon 602.

Returning to FIG. 6 for an understanding of the particularities of the layout, it will be understood by those skilled in the art that, in order to operate the transistor device of die 600, electrical contact must be made to all of the gate fingers represented by fingers 604, 606, 608 and 610, as well as to the source contact regions exposed by the openings in the patterned polysilicon 602 represented by opening 612. Additionally, it will be recognized that a third "drain" electrical contact must be made to the bottom surface of die 600, not shown. In order to simplify and reduce the cost of manufacturing the die, it is desirable to provide electrical contact to the gate fingers and to the source contact regions between the gate fingers with the same single level of metal. This idea is better understood with reference to FIG. 7.

Figure 7:
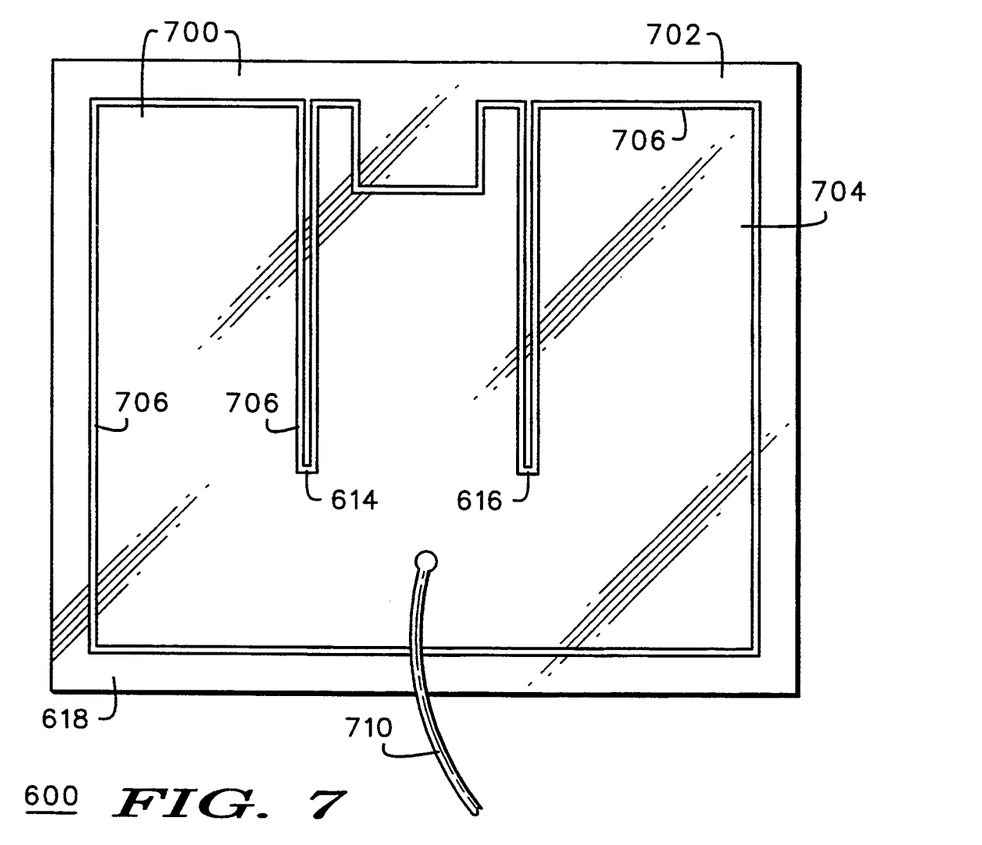
FIG. 7 is a top view of the semiconductor die of FIG. 6 further including a metal level.

FIG. 7 illustrates the die 600 of FIG. 6, further having a single level of metal 700 covering the die.

With reference to both FIGS. 6 and 7, it can be seen that portion 702 of metal layer 700 provides electrical contact to the patterned gate fingers, while portion 704 provides contiguous electrical contact to the source regions within openings 612 exposed by the polysilicon gate fingers 604, 606, 608 and 610. It will be understood by those skilled in the art that the patterned polysilicon 602 is covered with a dielectric in the areas over which portion 704 is formed, before metal layer 700 is formed. Consequently, metal layer portion 704 contacts the source regions (e.g. 612) while being insulated from the gate fingers (e.g. 604). Furthermore, it can be seen that metal layer portion 702 contacting the polysilicon gate fingers is electrically isolated from metal layer portion 704 contacting the source regions by gap 706.

Returning to FIG. 6 for further explanation of the layout, it can be seen that the layout seeks to reduce the length of the gate fingers (e.g. fingers 604), length herein meaning the distance from a furthest point on a gate finger to the gate feed network. The gate feed network is the portion of patterned polysilicon layer 602 which underlies metal layer portion 702 of FIG. 7. Consequently, the gate feed network includes extending feed fingers 614 and 616 and perimeter ring 618.

It is desirable to reduce the length of the gate fingers, because the resistance of the gate finger increases along its length. Consequently, the operating parameters of the transistor will correspondingly vary along the length of the gate finger. Therefore, gate finger lengths must be reduced to the point where there is no material variance of transistor operating parameters along the length of the gate fingers.

The layout shown in FIG. 6 provides relatively short gate finger lengths by providing the gate feed network which includes two extending feed fingers 614, 616, along with perimeter ring 618. Given this configuration, it can be seen that all of the gate fingers comprising the "upper" portion of the die generally indicated by arrow 620 have a gate finger length of less than 1/6 of the length of die 600, since each of these gate fingers is fed from both sides and the feed fingers divide the die into thirds. Note that gate fingers represented by fingers 610 are advantageously much smaller due to polysilicon portion 622 which underlies metal portion 706 (FIG. 7), which is provided for attaching a wire bond during packaging of die 600.

Given that the first group of gate fingers in upper portion 620 are of appropriate length for good performance of the transistor, it might be questioned as to why feed fingers 614 and 616 do not traverse the entire width of the die 600 such that all gate fingers have the same length. The answer is revealed in view of FIG. 7. Referring to FIG. 7, note that if feed fingers 614 and 616 traverse the entire width of die 600 then metal layer portion 704 would be segmented into three separate, non-contiguous and non-electrically connected portions. It must be held in mind, though, that in manufacturing, it is desirable to contact the source of the device via metal layer portion 704 with a single wire bond, illustrated as wire bond 710. Consequently, metal layer portion 704 must be contiguous.

Returning to FIG. 6, it should now be understood why a second group of gate fingers in the area indicated by the arrow 622 and represented by finger 608, is provided. The second group of gate fingers 622 are aligned perpendicular to the first group of gate fingers 620, and are fed by perimeter ring 618 of the gate feed network along with portion 624 of the patterned polysilicon. If these gate fingers weren't perpendicular, they would traverse the entire width of the device, and therefore be undesirably long. It should be noted that gate fingers generally indicated by arrows 626 are also acceptably short. Consequently, the layout illustrated by FIG. 6 provides gate fingers having lengths which are at least less than half of the longer of the length or width of die 600.

Figure 8:
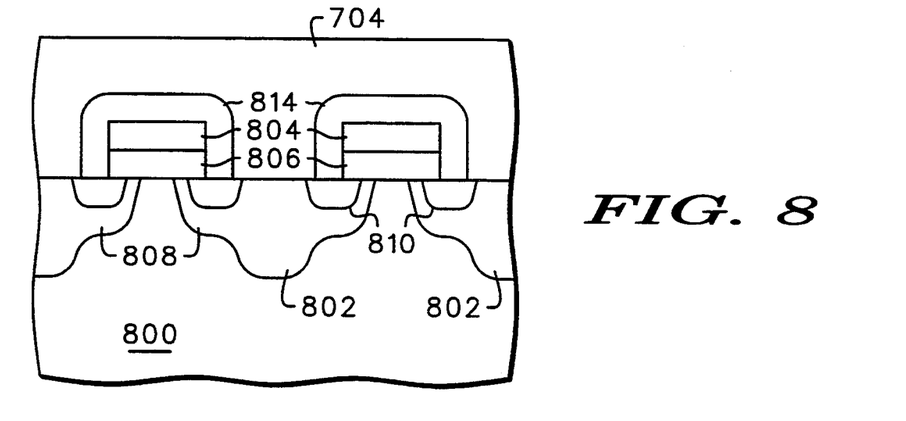
FIG. 8 is a simplified cross-section view representing a portion of a transistor.
Figure 9:
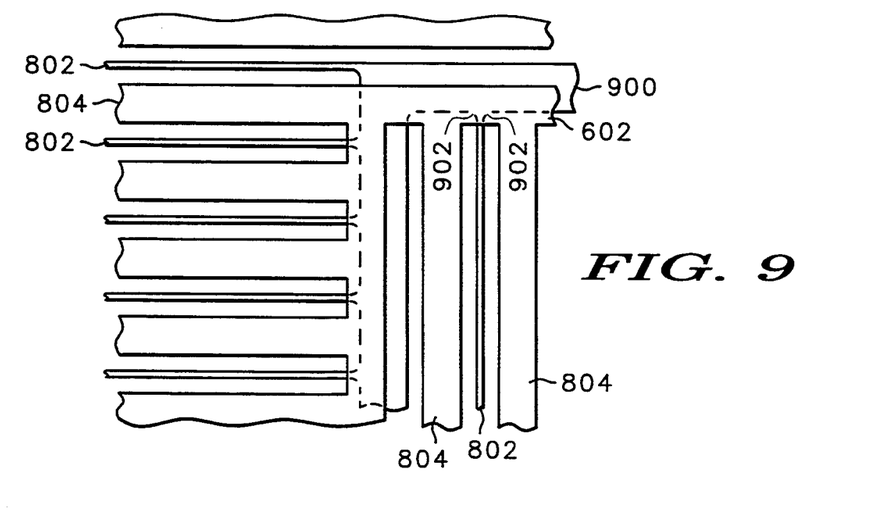
FIG 9 is an enlarged view of a portion of FIG. 6.

Turning now to FIGS. 8 and 9, FIGS. 8 and 9 illustrate certain advantageous methods for manufacturing the transistor die 600. FIG. 8 is an illustrative cross-section side view of the portion of die 600 indicated by arrows 8—8, and further including a dielectric covering the gate fingers and metal layer portion 704 (FIG. 7) covering the dielectric. Although one of ordinary skill in the art will recognize various methods for arriving at the device shown, the process is generally described here in order to point out certain advantageous ways of carrying out certain steps. Furthermore, only relevant steps will be discussed, and it will be understood that there are intervening steps which are well known in the art.

Accordingly to one preferred embodiment, N type semiconductor substrate 800 is provided. Initially, a P+ implant is carried out in order to form the P well portions 802, also referred to as the tub or base portion. As discussed in detail earlier, the base portion is all one single contiguous base. One notable feature of the implant is that a positive, latex based photoresist is used for the implant. Positive photoresist is desirable because it typically provides greater resolution, compared to negative photoresist. It will be recognized that it is desirable to reduce the spacing between gate fingers 804 as much as possible. Consequently, since the width of implant portions 802 limit the spacing of gate fingers 804, it is desirable to make implant portions 802 as narrow as possible.

After implanting portions 802, a gate oxide layer which forms oxide portions 806 is formed. Subsequently, a polysilicon layer which will result in gate fingers 804 is deposited over the gate oxide layer. It will be understood that both of these layers are initially formed as continuous sheets, and the fingers are defined later by etching.

Next, the polysilicon layer is patterned to form the gate fingers. In order to define the gate fingers 804 well known etching techniques are used. However, as in the previously discussed masking step, positive photoresist is used again in order to provide more fine definition than is available with negative photoresist. The gate oxide layer which will underlie the gate fingers is initially left as a conformal coating through which the implants (P− channel, N+ source) are performed.

Subsequent to implanting portions 808, a mask is defined through which source regions 810 are implanted. It should be recalled that, in certain preferred embodiments, the mask through which end type source regions 810 are implanted is configured such that certain adjacent source regions are cross connected, as illustrated in FIG. 4. Furthermore, in certain preferred applications, the photolithography processing for implanting N+ source regions 810 utilizes positive photoresist in order to achieve fine geometry.

Further photolithographic processing is conducted in order to provide the preohmic for metal contact to source regions 810, P tub regions 802, and gate polysilicon. Gate oxide portions 806 and dielectric 814 is patterned at this step. Again, positive photoresist is employed in order to achieve the fine geometry needed considering the extremely small stripe spacing.

One of the final steps, as will be recognized by those of ordinarily skill in the art, is the deposition of aluminum 812, which provides ohmic contact to the source regions 810 and P tub regions 802.

Turning to FIG. 9, FIG. 9 is a magnified view of portion 9 shown in FIG. 6, particularly illustrating the layout of the implant for forming P+ regions 802 (which can also be seen in FIG. 8) with reference to patterned polysilicon layers 602 (from FIG. 6), including gate fingers 804 (from FIG. 8). FIG. 9 illustrates an important feature with respect to implant layer 900 which includes regions 802. More specifically, all of the "corners", e.g., corners 902, are "inside corners" that is, the entire layer 900 is designed (laid out) so that there are no open ended stubs (outside corners), but rather only inside corners 902 throughout the layout. The reason for this inside corner layout is related to the fact that, as is well known, the base resistance of the transistor is directly related to the P+ implant doping concentration. When the implant layer 900 is implanted, and subsequently diffused during normal device fabrication, the P impurities at an inside corner will tend to defuse in an overlapping fashion. Consequently, the P+ doping concentrations at the corners will increase, thereby reducing base resistance in the corner areas. If, on the other hand, implant layer 900 included open ended stubs (outside corners) the P+ implant would thin out as it diffused. The diminishing P+ implant would increase base resistance, tending to cause device failure in the isolated areas where the P+ implant thins.

By now it will be appreciated that a transistor has been provided which can provide the advantages of efficient and effective device layout, improved energy, breakdown voltage, lower on-resistance, lower capacitance and higher packing density.

While we have shown and described specific illustrative embodiment of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

We claim:

1. A transistor comprising:
    a vertically stacked semiconductor structure comprising a first surface and a second surface parallel to the first surface, the transistor configured to conduct current from the first surface to the second surface;
    one or more source regions comprising a first material, the one or more source regions formed in the single common base region, wherein certain adjacent ones of the one or more source regions are cross-connected with the first material.

2. The transistor of claim 1, further comprising a gate region overlying the common base region, the gate region comprising a central portion and edge portions, the central portion being higher than the edge portions.

3. The transistor of claim 2, further comprising a pre-gate implant region beneath the first-surface, wherein the pre-gate implant region is discontinuous in an area underlying the central portion of the gate region.

4. The transistor of claim 1, further comprising a pre-gate implant layer beneath the first surface.

5. The transistor of claim 4, further comprising an elongated source region comprising a first dopant type formed in the single common base region, an elongated gate region overlying the first surface, and a pre-gate implant layer beneath the first surface comprising the first dopant type, the pre-gate implant layer being discontinuous in the area beneath the elongated gate region.

6. The transistor of claim 1, wherein the single common base region comprises at least two elongated base portions connected by a border region.

7. The transistor of claim 1, wherein the transistor comprises a MOSFET.

8. A transistor comprising:
    a common base region;
    one or more source regions formed in the common base region; and
    one or more gate regions overlying the common base region and the one or more source regions, wherein each of the gate regions comprises an elongated gate finger having a cross-section, the cross section having a central portion and edge portions, and wherein the central portion is thicker than the edge portions.

9. The transistor of claim 8, further comprising a pre-gate implant layer beneath the one or more gate regions, the pre-gate implant layer discontinuous in areas beneath the central portions of the gate regions.

10. The transistor of claim 8, wherein certain adjacent ones of the one or more source regions are cross connected.

11. The transistor of claim 8, wherein the common base region comprises at least two elongated base portions connected by a border region.

12. The transistor of claim 8, wherein the transistor comprises a MOSFET.

13. A vertical transistor comprising:
    a common base region;
    a plurality of elongated source regions comprising a first doped material, the plurality of source regions formed in the common striped base region, certain adjacent ones of the source regions being cross-connected with the first doped material; and
    one or more gate fingers overlying the common striped base region and the one or more source regions.

14. The vertical transistor of claim 13, wherein each of the one or more gate fingers comprises a central portion and edge portions, the central portion being higher than the edge portions.

15. The vertical transistor of claim 13, wherein the common striped base region comprises at least two stripes and a border region connecting the stripes.

16. A transistor comprising:
    a semiconductor die having a length and a width;
    a patterned gate region comprising a plurality of gate fingers, the patterned gate region exposing a plurality of source contact regions;
    a gate feed network;
    each of the plurality of gate fingers having a gate finger length which is a distance from a furthest point on the gate finger to the gate feed network;
    a single metal level contacting the gate feed network and the plurality of source contact regions, the gate feed network being electrically isolated from the plurality of source contact regions, the plurality of source contact regions being contiguously electrically coupled; and wherein a maximum gate finger length is less than one half of the larger of the semiconductor die length and width.

17. The transistor of claim 16, wherein the plurality of gate fingers comprises a first group of gate fingers aligned in a first direction and a second group of gate fingers aligned in a second direction perpendicular to the first direction.

18. The transistor of claim 17, wherein the gate feed network comprises a perimeter ring and at least one extending feed finger, the extending feed finger feeding the first group of gate fingers and the perimeter ring feeding the second group of gate fingers.

19. The transistor of claim 18, comprising two extending feed fingers.

20. The transistor of claim 16, wherein the gate feed network comprises a perimeter ring and at least one extending feed finger, the extending feed finger feeding the first group of gate fingers and the perimeter ring feeding the second group of gate fingers.

21. A transistor comprising:

a plurality of source regions interspersed in a plurality of parallel aligned gate fingers;

a single metal level providing electrical contact to both the plurality of source contact regions and the plurality of gate fingers, the plurality of source regions being contiguously electrically coupled; and a single external electrical contact contacting the plurality of source regions via a portion of the single level of metal.

22. The transistor of claim 21, wherein the plurality of gate fingers comprises a first group of gate fingers aligned in a first direction and a second group of gate fingers aligned in a second direction perpendicular to the first direction.

23. The transistor of claim 22, further comprising a gate feed network comprising at least one extending feed finger and a perimeter ring, the extending feed finger feeding the first group of gate fingers and the perimeter ring feeding the second group of gate fingers.

24. The transistor of claim 23, comprising two extending feed fingers.

* * * * *

UNITED STATES PATENT AND TRADEMARK OFFICE
CERTIFICATE OF CORRECTION

PATENT NO. : 5,396,097
DATED : March 7, 1995
INVENTOR(S) : Robb et al.

It is certified that error appears in the above-indentified patent and that said Letters Patent is hereby corrected as shown below:

On the title page, after "Phoenix, Ariz. 85019", insert paragraph
--[73] Assignee:   Motorola, Inc., Schaumburg, Ill.--.

Column 7, claim 1, line 54, after the word "surface;" insert
paragraph --a single common base region; and--.

Signed and Sealed this

Sixteenth Day of January, 1996

Attest:

BRUCE LEHMAN

*Attesting Officer*            *Commissioner of Patents and Trademarks*